United States Patent [19]
Okazawa

[11] Patent Number: 5,309,402
[45] Date of Patent: May 3, 1994

[54] FLASH ELECTRICALLY ERASABLE AND PROGRAMMABLE ROM

[75] Inventor: Takeshi Okazawa, Tokyo, Japan

[73] Assignee: NEC Corporation, Tokyo, Japan

[21] Appl. No.: 835,357

[22] Filed: Feb. 14, 1992

[30] Foreign Application Priority Data

Feb. 15, 1991 [JP] Japan .................................. 3-021885

[51] Int. Cl.[5] ............................................ G11C 11/40
[52] U.S. Cl. ..................................... 365/218; 365/185; 365/189.11; 365/900
[58] Field of Search ..................... 365/218, 189.11, 185, 365/900

[56] References Cited

U.S. PATENT DOCUMENTS 5,022,000  6/1991  Terasawa et al. ............... 365/189.11
5,077,691 12/1991  Haddad et al. ...................... 365/218
5,084,843  1/1992  Mitsuishi et al. .................... 365/218

OTHER PUBLICATIONS

Virgil Niles Kynett et al, "An In-System Reprogrammable 32K×8 CMOS Flash Memory", IEEE Journal of Solid-State Circuits, vol. 23, No. 5, Oct. 1988, pp. 1157-1163.

S. Aritome et a, "A Reliable Bi-Polarity Write/Erase Technology In Flash EEPROMs", IEDM Technical Digest, 1990, pp. 111-114.

N. Ajika et al, "A 5 Volt Only 16M Bit Flash EEPROM Cell With a Simple Stacked Gate Structure", IEDM Digest, 1990, pp. 115-118.

*Primary Examiner*—Eugene R. LaRoche
*Assistant Examiner*—Christopher Glembocki
*Attorney, Agent, or Firm*—Sughrue, Mion, Zinn, Macpeak & Seas

[57] ABSTRACT

A flash EEPROM with sector erasure, carries out the erasure by applying a negative voltage to a selected word line through an N-channel MOS transistor. P-channel MOS transistors are respectively inserted between row decoder level shifters and each of their respective word lines to which they are respectively connected. The turning-on and -off of the respective word lines and first level shifters is controlled by the turning-on and -off of the associated P-channel MOS transistor. An erase voltage is applied to one end of the source-/drain path of the respective N-channel MOS transistor of the selected cord line, the other end to the respective word lines. The turning-on and -off of the N-channel MOS transistor is synchronized with the turning-on and -off of the P-channel MOS transistor connected to the same word line. The P-channel MOS transistor is formed on an N well biased to, for example, 5 V and the N-channel MOS transistor is formed on a P well biased to, for example, the erase voltage. The P well is formed on the surface of the N well.

9 Claims, 7 Drawing Sheets

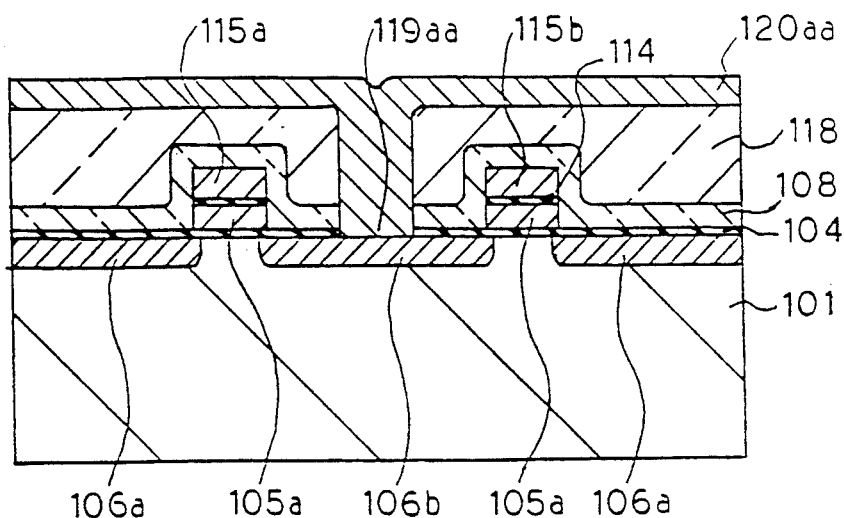
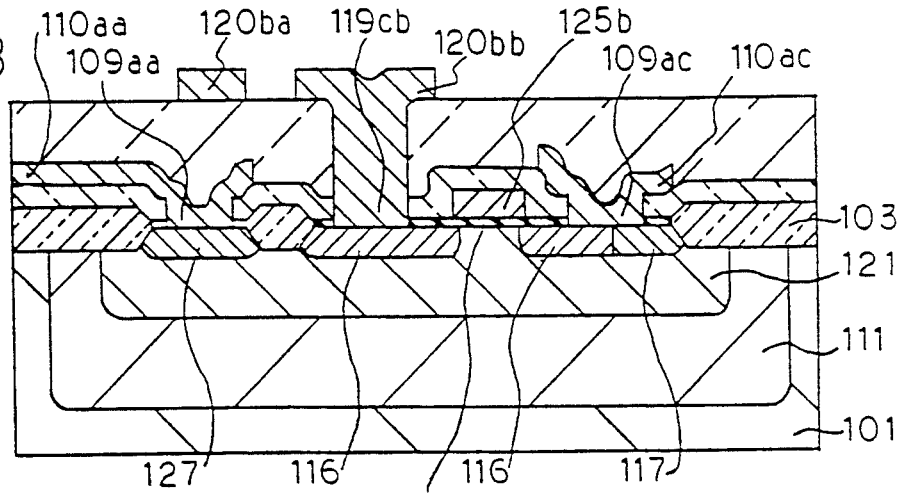
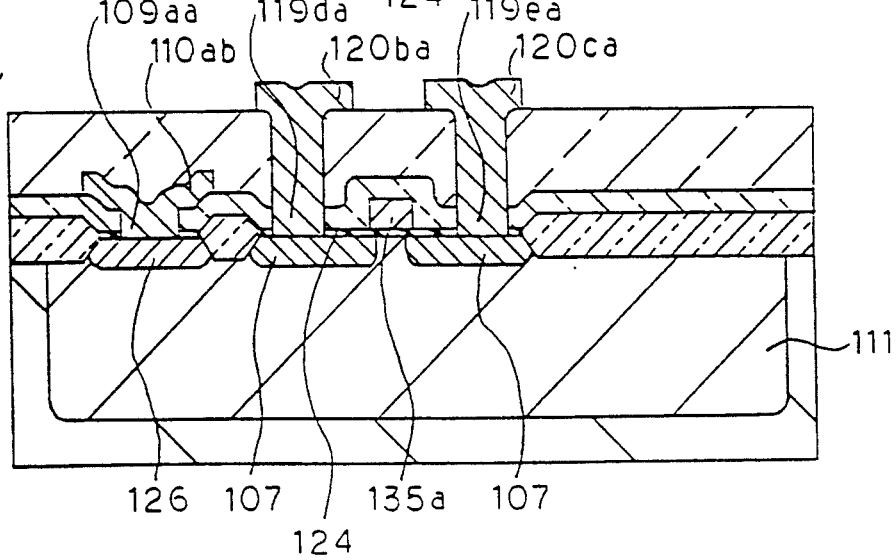

FLASH ELECTRICALLY ERASABLE AND PROGRAMMABLE ROM

BACKGROUND OF THE INVENTION

1. Field of the Invention

The present invention relates to an electrically erasable and programmable ROM (referred to as an EEPROM hereinafter), and more particularly, to an EEPROM in which a negative voltage is applied to the control gate for erasure.

2. Description of the Prior Art

A conventional EEPROM is constituted of a peripheral circuit that includes memory cells arranged in matrix form along word lines and bit lines, a row decoder, and a column decoder. Level shifters are arranged between the row decoder and the word lines and between the column decoder and the bit lines, respectively. The write or read or erase operation for each selected memory cell is carried out as in the following. Namely, by virtue of a designation signal of write or read or erase and address signals, a row output and a column output from the row decoder and the column decoder are input to the respective level shifters, and a row signal having a voltage corresponding to the write or read or erase operation and a column signal having a voltage corresponding to the write or read or erase operation are output from the respective level shifters to a designated word line and a designated bit line.

The conventional EEPROM memory cell is constituted of a select transistor consisting of an N-channel MOS transistor and an N-channel MOS transistor having a stacked gate type structure (a laminated structure of a floating gate and a control gate). In order to avoid possible confusion as to the definition of write and erase operations, it will tentatively be defined here that the write operation is one in which electron injection to the floating gate takes place while the erase operation is one in which electron emission from the floating gate takes place, analogous to the case for an EEPROM. In such an EEPROM it is necessary to carry out the erase operation for every memory cell so that the length of the erase time will become of importance when an erase operation for a large number of memory cells is to be carried out. For such a reason, when the connection of the memory cells is of the NOR type, for example, there has been proposed the flash type EEPROM (abbreviated as a flash memory hereinafter) which has at least the function of erasing simultaneously and in a lump all the data written on the memory cells that belong to the same word line (in particular, erasure for each unit, with one row or a plurality of rows as a unit, is called sector erasure). Because of this, the flash memory has an advantage of reducing the cell size due to the reduction in the erasure time in comparison to the conventional EEPROM and the elimination of the necessity for the select transistors.

Such a flash memory is reported, for example, in *IEEE Journal of Solid-State Circuits*, Vol. 23, No. 5, pp. 1157-1162. According to the report, the memory cell is constituted of a first gate insulating film (thickness of about 10 nm) provided on the surface of a P-type silicon substrate, a floating gate consisting of $N^+$-type polycrystalline silicon provided on the gate insulating film, a second gate insulating film (thickness of about 25 nm) provided on the top face of the floating gate, a control gate provided on the gate insulating film, and an $N^+$-type source and drain provided on the surface of the silicon substrate in self-alignment with these gates.

The operation of a memory cell with the above-mentioned structure can generally be described as follows. For writing to the memory cell, voltages of 7 V, for example, to the drain, 0 V (ground potential) to the silicon substrate and the source, and 12 V, for example, to the control gate, are applied. Since the floating gate is not connected to an external power supply, its potential is uniquely determined by the ratio of the electrostatic capacities due to the first gate insulating film and the second gate insulating film, and the potentials of the control gate, the source, the drain, and the silicon substrate. Ordinarily, by setting the potential of the control gate to be comparable to the potential of the drain, the injected quantity of the hot electrons (electrons having energies that exceed the energy barrier height of the first gate insulating film) generated by the current that flows between the source and the drain to the floating gate is maximum, so that the aforementioned potential setting is prevalent. As a result, electrons are injected to the floating gate pushing down the potential of the floating gate even to a negative level, and shifts the threshold of the memory cell to the positive direction. Ordinarily, the threshold of the memory cell at this time is set to be about 7 V.

Focusing the attention on one memory cell, the erasure of the memory cell (that is, the erasure of a written data) is to draw the electrons that were injected to the floating gate as in the above from the floating gate. For this purpose, the following method is frequently adopted. That is, a voltage of 12 V, for example, is applied to the source, 0 V (ground potential) is applied to the silicon substrate and the control gate, and the drain is left in the open state. Although the potential of the floating gate is determined uniquely as mentioned above, the floating gate is at a negative potential in the state where the the memory cell is written, so that a potential difference corresponding to this component is added further and a fairly strong electric field (greater than 10 MV/cm at this time) is applied to the first gate insulating film between the source and the floating gate. Under such a strong electric field the Fowler-Nordheim current based on the quantum mechanical tunnel effect flows in the first gate insulating film. Utilizing this effect, electrons are drawn from the floating gate to the source, performing the erasure of the memory cell. For example, in a device of the NOR type, the sources of the memory cells connected to the same word line have a common potential so that when one memory cell is erased, at least the remaining memory cells belonging to the same word line will also be erased.

In the conventional flash memory, the erasure method that draws electrons to the source as described in the above has certain problems which deteriorate the reliability of the cell. At this time, a high voltage in the reverse direction of about 12 V with respect to the P-N junction of the source is applied to the source, which was found to create two problems. A first problem is the junction breakdown and a second problem is the generation of hot holes (holes having energies that exceed the energy barrier height of the first gate insulating film) and their injection into the floating gate which takes place prior to the occurrence of the junction breakdown.

To cope with these problems there have been proposed methods for drawing the electrons from the floating gate without applying a high reverse voltage to the source. According to a first method reported in *IEDM Technical Digest*, 1990, pp. 111-114, erasure is carried out by applying voltages of 5 V to the source and −12 V to the control gate while leaving the drain in the open state. In this method the voltage applied to the source is low so that the junction breakdown would not be generated. The key point of this method is to push out the electrons accumulated in the floating gate to the source side by the application of a negative voltage to the control gate. On the other hand, according to a second method as reported in *IEDM Technical Digest*, 1990, pp. 115-118, erasure is carried out by applying 0 V (ground potential) to the control gate and applying positive voltages to the source, the drain, and the silicon substrate. The write operation in this method is realized by applying 0 V (ground potential) to the source, the drain, and the silicon substrate, and applying a positive voltage to the control gate alone. The advantage of this method resides in the fact that the application of a high local electric field to the source can be avoided at the time of write or erase, thereby enhancing the reliability of the memory cell.

Both of the above-mentioned methods do have respective features in enhancing the reliability of the memory cell. Note that the contents of these reports place the emphasis on the memory cells, and make no reference to the peripheral circuits. However, when one considers these reports by including up to the peripheral circuits, the presence of different kinds of problem surfaces up. Thus, in the first method, it becomes necessary to pay attention to the constitution of the elements of the circuit that outputs the voltage of −12 V. For example, in an N-channel MOS transistor that constitutes a level shifter connected to the row decoder, a voltage in the forward direction is to be applied to the source or the drain of the transistor which causes a serious problem. Furthermore, a positive voltage is applied to the source, in this method, at the time of erasure, so that it is necessary to isolate the sources that belong to the adjacent word line in order to carry out the sector erasure, which causes an increase in the cell size. On the other hand, the second method has a drawback in that it is applicable to the NAND type EEPROM alone and is not applicable to the NOR type EEPROM.

BRIEF SUMMARY OF THE INVENTION

Objects of the Invention

It is an object of the invention to provide an EEPROM which includes highly reliable memory cells and a highly reliable peripheral circuit.

It is an object of the invention to provide an EEPROM which includes highly reliable stacked memory cells and a highly reliable peripheral circuit.

It is an object of the invention to provide a flash EEPROM which includes highly reliable stacked memory cells and a highly reliable peripheral circuit.

It is an object of the invention to provide a flash EEPROM facilitating the sector erasure which includes highly reliable stacked memory cells and a highly reliable peripheral circuit.

It is an object of the invention to provide a flash EEPROM which includes highly reliable stacked memory cells with small cell size and a highly reliable peripheral circuit.

It is an object of the invention to provide a flash EEPROM facilitating the sector erasure which includes highly reliable stacked memory cells with small cell size and a highly reliable peripheral circuit.

It is an object of the invention to provide a NOR type or a NAND type flash EEPROM which includes highly reliable stacked memory cells with small cell size and a highly reliable peripheral circuit.

It is an object of the invention to provide a NOR type or a NAND type flash EEPROM facilitating the sector erasure which includes highly reliable stacked memory cells with small cell size and a highly reliable peripheral circuit.

SUMMARY OF THE INVENTION

In a flash memory which has on the surface of a P-type silicon substrate stacked gate type memory cells arrayed in matrix form along bit lines and word lines served also as control gates, and a peripheral circuit which includes at least first level shifters connected respectively to one end of the respective word lines and a row decoder connected to the first level shifters, and carriers out erasure by applying a predetermined substrate voltage to the silicon substrate and applying an erase voltage which is negative with respect to the substrate potential to a control gate, the EEPROM according to the invention includes a first N well formed on the surface of the P-type silicon substrate and is applied a first voltage higher than the voltage potential, has on the surface of the first N well first P-channel MOS transistors in number corresponding to the number of word lines, with one of the source and the drain of the respective transistors being connected to the respective word lines and the other of the source and the drain of them being connected to the respective first level shifters, has a first P well formed on the surface and enfolded by the first N well with the erase voltage being applied to it, provided with first N-channel MOS transistors in number corresponding to the number of word lines formed on the surface of the first P well, with one of the source and the drain of the respective transistors being connected to the first P well and the other of the source and the drain of them being connected to the respective second level shifters, has an input terminal which inputs an input signal consisting of the substrate potential or the first voltage and an output terminal which outputs a second voltage with value greater than the substrate potential or an erase voltage, and has at least one of second level shifter, with its output being connected to the gate of at least one of the first N-channel MOS transistor and its input terminal being connected at least to the gate of a first P-channel MOS transistor connected to the first N-channel MOS transistor.

Preferably, the EEPROM has a sector decoder, second level shifters are provided corresponding to the respective word lines, and the outputs of the sector decoder are input to the input terminals of the respective second level shifters.

Preferably, the EEPROM has a second N well formed on the P-type silicon substrate and is given the second voltage, and a second P well formed on the surface and enfolded by the second N well and is given the erase voltage, provided with a second and a third P-channel MOS transistors formed on the surface of the second N well with their respective sources connected to the second N well, provided with a second and a third N-channel MOS transistors formed on the surface of the second P well with their respective sources connected to the second P well, and has the second level shifter constructed by the flip-flop connection of a first CMOS inverter having the second N-channel MOS transistor as a driver and the second P-channel MOS transistor as a load, and a second CMOS inverter having the third N-channel MOS transistor as a driver and the third P-channel MOS transistor as a load, wherein the inputs to the first and the second inverters are mutually in the opposite phases.

Preferably, the EEPROM is a NOR type or a NAND type flash memory.

In the EEPROM according to this invention, when the input signal to the second level shifter is the substrate potential or the first voltage, the output signal is the second voltage or the erase voltage. Because of this, when the memory cells belonging to a certain word line are erased simultaneously, the input signal to the second level shifter is the first voltage, and the first P-channel MOS transistor is turned off so that the word line and the first level shifter connected thereto are disconnected. On the other hand, the output signal from the second level shifter at this time is the second voltage, and the first N-channel MOS transistor is turned on and the erase voltage is applied to this word line. At this time, other first P-channel MOS transistors are turned on, other first N-channel MOS transistors are turned off, the word lines connected to these transistors are not given the erase voltage, and are connected to the respective first level shifters.

Because of this, in the EEPROM of the invention, in spite of the fact that erasure is executed by the erasure voltage which has a negative value with respect to the substrate potential, even if the erase voltage with this negative value is applied to the source and the drain of a first N-channel MOS transistor, there will be generated no forward voltage in the transistor because the transistor is formed on the first P well which is given the erase voltage. Similar circumstances applied also to a first P-channel MOS transistor. Moreover, the separation of potentials is easy because there is interposed the first N well between the P well and the P-type silicon substrate.

Furthermore, in the EEPROM according to the invention it is not necessary to apply a voltage higher than the substrate potential to the sources of the memory cells in order to carry out erasure. Because of this, the memory cells can be given a high reliability, and memory cells with small cell size can be obtained since no isolation between the memory cells belonging to the adjacent word lines is required.

In addition, the EEPROM of this invention makes it possible to carry out the sector erasure because of the aforementioned constitution, and the invention can be applied without any limitation to the EEPROM of the NOR type or the NAND type.

BRIEF DESCRIPTION OF THE DRAWINGS

The above-mentioned and other objects, features, and advantages of this invention will become more apparent by reference to the following detailed description of the invention taken in conjunction with the accompanying drawings, wherein:

FIGS. 3A to 3C are schematic sectional views of the first embodiment along the line A—A, the line B—B, and the line C—C in FIG. 2;

DETAILED DESCRIPTION OF THE PREFERRED EMBODIMENTS

Figure 1:
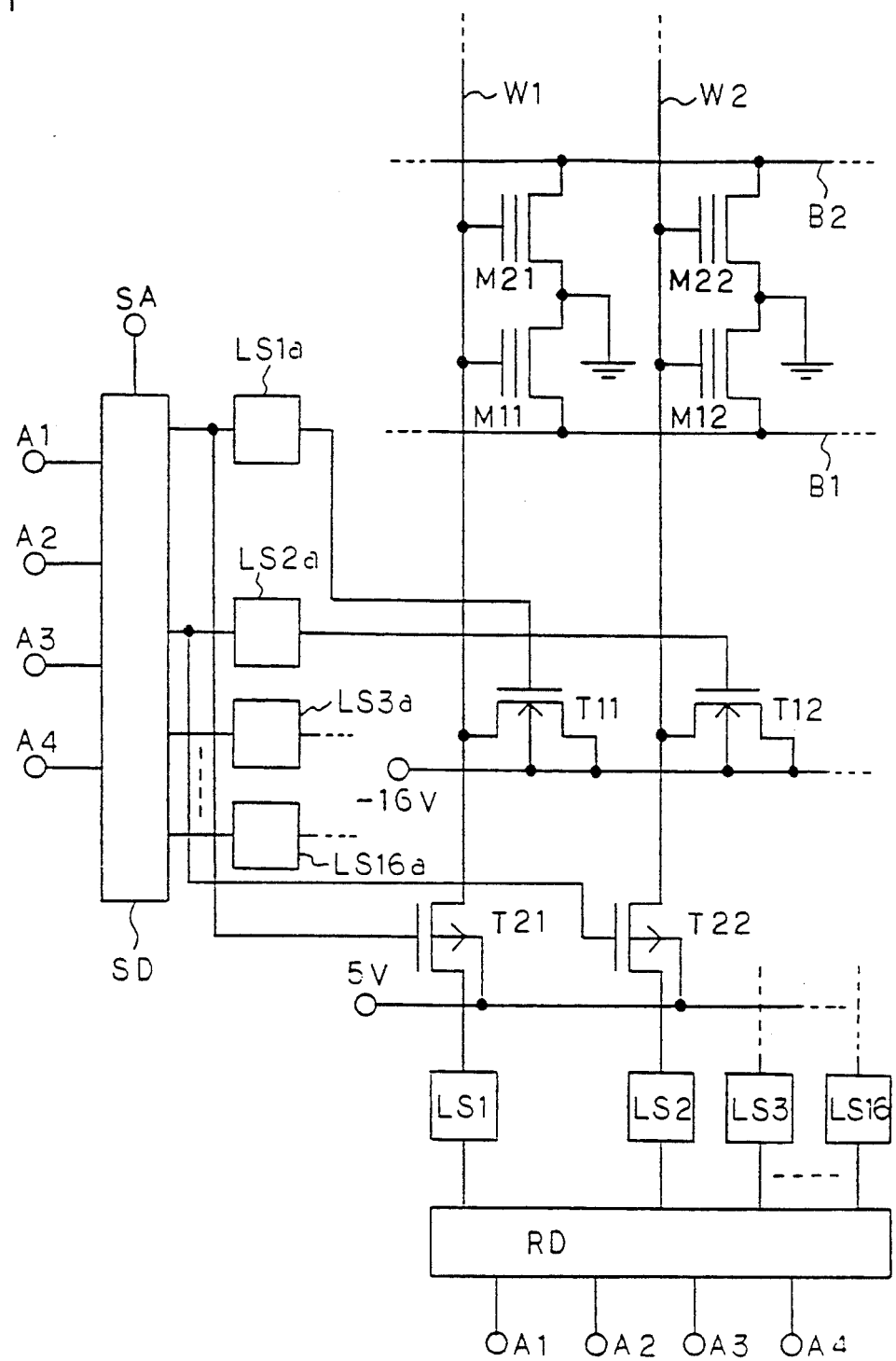
FIG. 1 is a circuit diagram for describing the circuit constitution of a first embodiment of the invention.

Next, referring to the drawings, this invention will be described.

Referring to FIG. 1 which shows the principal part of the circuit constitution of a flash memory formed on the surface of a P-type silicon substrate, the first embodiment of the invention is a flash memory with 16-bit constitution, and memory cells (M11, M12, M21, M22, and the like) are arrayed in matrix form and in NOR type along word lines (W1, W2, and the like) and bit lines (B1, B2, and the like). The sources of M11, M12, M21, M22, and the like are maintained for all time at 0 V which is the substrate potential. The lines W1, W2, and the like are connected to a pair of switching transistors, namely, a first N-channel MOS transistor T11 and a first P-channel MOS transistor T21, a first N-channel MOS transistor T12 and a first P-channel MOS transistor T22, and the like, respectively.

The first P-channel MOS transistors (T21, T22, and the like) are formed on the surface of a first P well (not shown, but will be described in more detail later) kept at 5 V which is a first voltage (being equal to a source voltage Vcc of this flash memory). One of the source and the drain of each of T21, T22, and the like is connected to each of W1, W2, and the like, and the other of the source and drain of each of T21, T22, and the like is connected to each of first level shifters (LS1, LS2, and the like). Because of this, T21, T22, and the like are turned on at 0 V, for example, and are turned off at 5 V, for example, functioning as the switching transistors between W1, W2, and the like and LS1, LS2, and the like. Here, the first voltage has to have a value (namely, a value greater than 0 V) for which the first N well does not correspond to the application of a forward voltage with respect to the P-type silicon substrate. Considering the input voltages to the gates of T21, T22, and the like it is preferable to have these first P-channel transistors turned on and off at 0 V (substrate potential) and at 5 V (Vcc). (For example, if the first voltage is chosen to be 0 V, then a voltage lower than −1 V is required to turn on these transistors, requiring a voltage generation circuit exclusively for this purpose.)

The first N-channel MOS transistors (T11, T12, and the like) are formed on a first P well (not shown here, but will be described in detail later on) which is given a potential of −16 V which is an erase voltage. One of the source and the drain of each of T11, T12, and the like is connected to W1, W2, and the like, respectively, and the other of the source and the drain is connected to the first P well. Because of this arrangement, T11, T12, and the like are turned on at 0 V, for example, and are turned off at −16 V, for example, and thus function as switching transistors whether or not to apply the erase voltage to W1, W2, and the like. The first P well is formed on the surface of the first N well, and because of this it is possible to apply the erase voltage to the first P well.

It should be mentioned that if it is desired to connect T11, T12, and the like to the end parts of W1, W2, and the like on the side where W1, W2, and the like are connected to LS1, LS2, and the like, T11, T12, and the like have to be provided respectively between T21, T22, and the like and M11, M12, and the like. Note, however, that T11, T12, and the like may also be provided at the other respective end parts of W1, W2, and the like.

The address signals are input to a row decoder (RD) and a sector decoder (SD) via the respective 4-bit address signal input terminals A1, A2, A3, and A4. The sector decoder is connected to 16 of second level shifters LS1a, LS2a, LS3a, . . . , and LS16a. A sector active signal which is an erase instruction is input to SD from an input terminal SA. The sector active signal is at 0 V when a write or read instruction is given or when the system is at standby whereas it is at 5 V when a write or read instruction is not given and an erase instruction is given.

The output signals (LS1a, LS2a, LS3a, . . . , and LS16a) from SD are input to the gates of T21, T22, and the like to determine the on (0 V) or the off (5 V) of T21, T22, and the like. For this purpose, SD has to have the following function. When the sector active signal is at 0 V, the output signals from SD are all at 0 V regardless of the address signals, and when the sector active signal is at 5 V, the output signal (or signals) from SD is (or are) 5 V only for a sector (or sectors) selected by the address signals, and the output signals from SD at nonselected sectors are 0 V. An SD with such a function is easily realizable by the use of well-known technology.

The output signals from the second level shifters (LS1a, LS2a, and the like) are input to the gates of T11, T12, and the like to determine the on (0 V) or the off (−16 V) of T11, T12, and the like. For this purpose, LS1a and the like have to have a function to have output signals of −16 V, and 0 V which is the second voltage for the input signals of 0 V and 5 V. A circuit constitution with such a function can readily be obtainable based on the well-known technology. The expedients from the viewpoint of device design and the second voltage will be described in more detail later.

Sixteen first level shifters (LS1, LS2, LS3, . . . , and LS16) are connected to RD. Upon inputting of a write or a read instruction signal (the input terminal for this signal is not shown) and address signals to RD a specified row is selected. Since all of T21, T22, and the like are turned on and all of T11, T12, and the like are turned off, a voltage (15 V, for example) corresponding to the write operation or a voltage (5 V, for example) corresponding to the read operation from the selected first level shifter LS1, for example, is applied to W1. Simultaneously, a voltage (7 V, for example) corresponding to the write operation or a voltage (1 V or so) corresponding to the read operation is output from a column decoder (not shown) and level shifters (not shown) connected thereto to a selected bit line (B2, for example). With this arrangement, write or read to M21, for example is carried out. Note that 0 V is applied at this time to all of the nonselected word lines and nonselected bit lines. Moreover, at the time of standby or an erase instruction, the output voltages from LS1, LS2, LS3, . . . , and LS16 and the output voltages from all of the level shifters connected to the column decoder are all at 0 V.

On the other hand, if there is no read instruction and an erase instruction is given, this signal is combined with the address signals from A1, A2, A3, and A4 in response to the input of a 5 V sector signal to SD from SA, and a sector (or sectors) is selected. For example, when the first row alone is selected, 5 V is applied to the gate of T21 alone, out of the first P-channel MOS transistors, to turn off T21 alone. As a result, W1 alone is disconnected from the first level shifter (LS1). On the other hand, when 0 V is applied to the gate of T11 alone, output of the first N-channel MOS transistors, T11 alone is turned off. Because of this, the erase voltage is applied via T11 to only W1 which is disconnected from LS1, and only M11, M21, and the like of the memory cells that belong to W1 are sector erased. At this time, there will occur no erroneous erasure since 0 V is applied to other nonselected word lines such as W2, and since 0 V (the substrate potential) is applied also the drains of all of the memory cells including the selected memory cells. Moreover, it becomes possible to select a plurality of word lines (could also be all of the word lines) by contriving the address signals that are input to A1, A2, A3, and A4.

Figure 2:
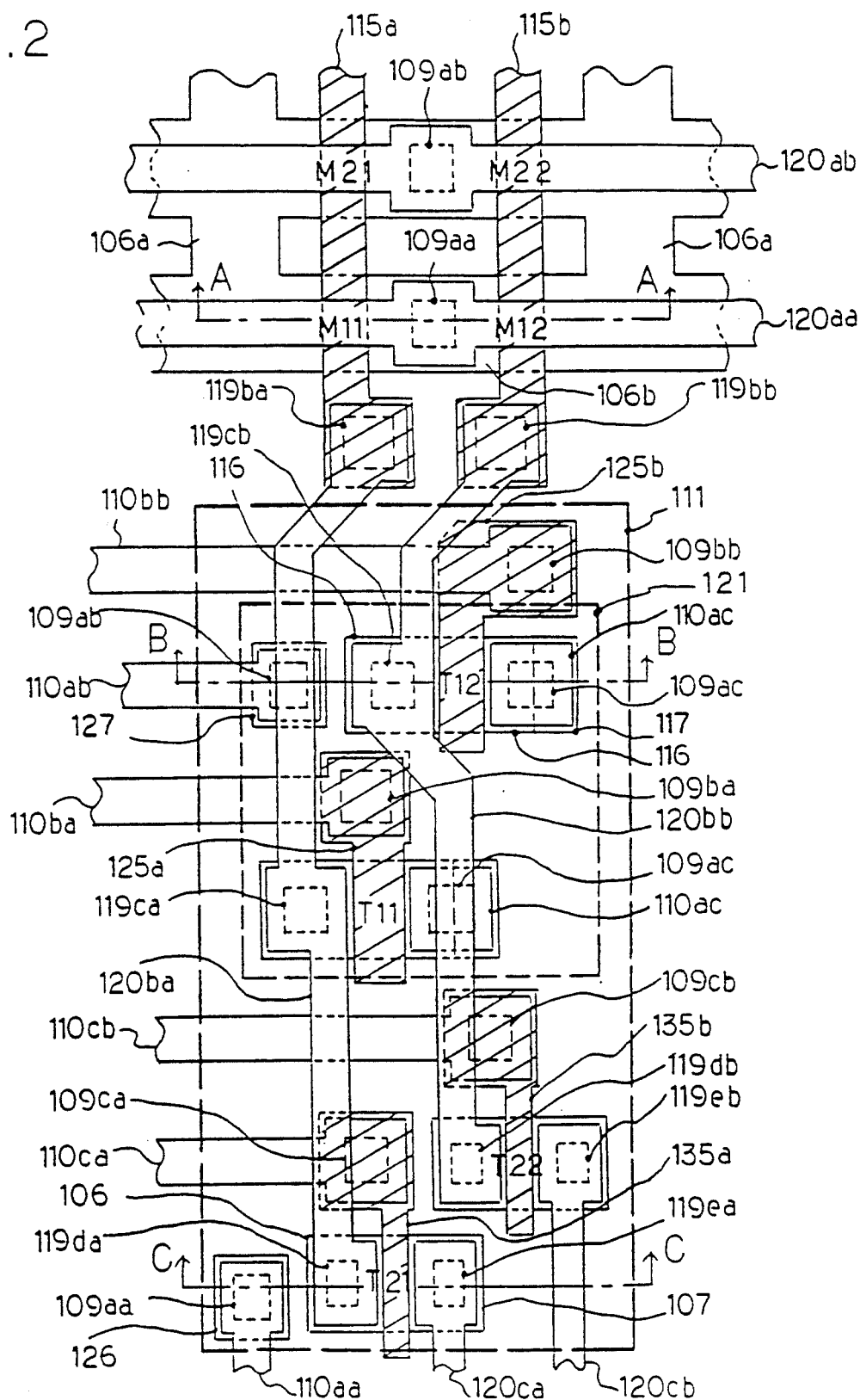
FIG. 2 is a schematic plan view for describing the first embodiment from the device aspect.
Figure 4A:
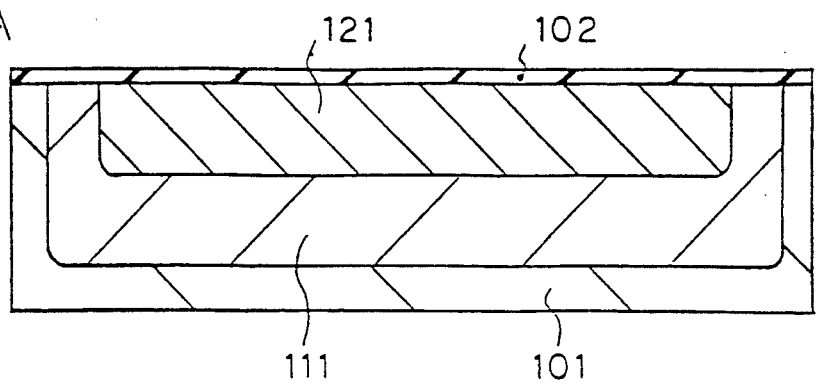
FIGS. 4A to 4E are schematic sectional views for the part corresponding to the line B—B in FIG. 2 arranged in the order of processes for describing the fabrication of the first embodiment.
Figure 4B:
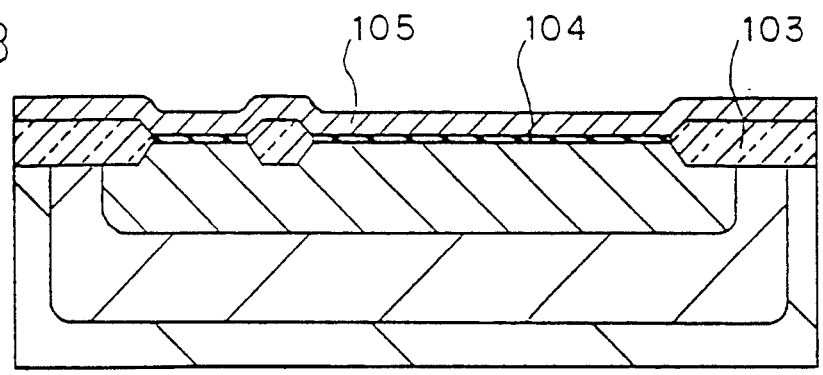
Figure 4C:
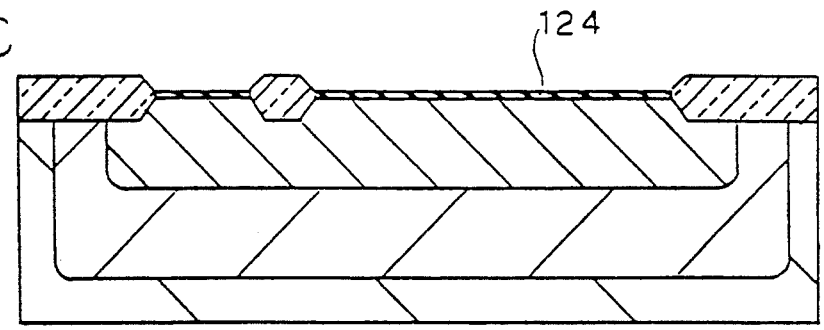
Figure 4D:
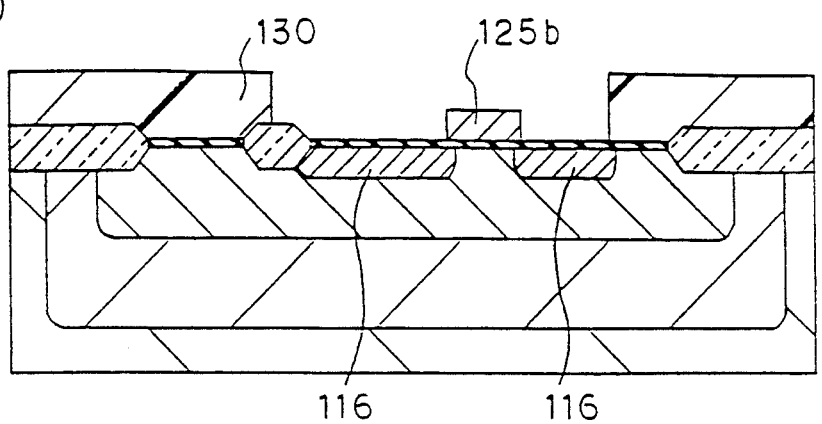
Figure 4E:
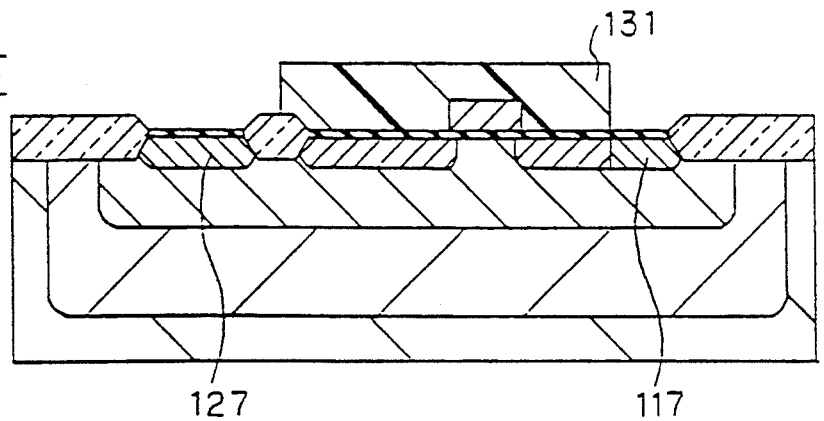

Referring also to FIG. 2 which is the principal part of the flash memory and FIGS. 3A to 3C which are schematic sectional views along the line A—A, line B—B, and line C—C in FIG. 2, the first embodiment of the flash memory has a constitution as described below.

The memory cells M11, M12, M21, M22, and the like are formed on the surface of the P-type silicon substrate 101 (impurity concentration of $10^{16}$ to $10^{17}$ cm$^{-3}$), have respectively a source 106a and a drain 106b each consisting of an N$^+$-type diffused layer, and have respectively a floating gate 105a consisting of a first gate insulating film 104 (a silicon oxide film with thickness of about 10 nm formed by thermal oxidation) and an N$^+$-type polycrystalline silicon film (with thickness of about 0.15 μm), and a second gate insulating film 114 (with film thickness of about 20 nm when converted to an equivalent silicon oxide film). The memory cells M11 and M12 have a control gate 115a that serves also as W1, and M21 and M22 have a control gate 115b that serves also as W2. Further, W1 is constituted of the control gate 115a and a second aluminum wiring 120ba (with thickness of about 1.0 μm) that is connected to the control gate 115a via a contact hole 119ba, and W2 is constituted of the control gate 115b and a second aluminum wiring 120bb connected to the control gate 115b via a contact hole 119bb. The drains 106b of the memory cells M11 and M12, and M21 and M22 are connected via contact holes 109aa and 109ab respectively to a bit line B1 consisting of a second aluminum wiring 120aa and a bit line B2 consisting of a second aluminum wiring 120ab. Here, the contact holes 109, 119, and the like are formed by etching a first interlayer insulating film 108 (a silicon oxide film with thickness of about 0.1 μm) and a second interlayer insulating film 118 (a filicon oxide film with thickness of about 1.0 μm) [FIGS. 1, 2, and 3A].

On the surface of the P-type silicon substrate 101 there is provided a first N well 111 (with impurity concentration of about $10^{17}$ cm$^{-3}$), and a first P well 121 (with impurity concentration of about $10^{18}$ cm$^{-3}$ and junction depth of 0.5–1.0 μm). The transistors T11, T12, and the like are formed on the surface of the P well 121. The transistors T11, T12, and the like have a source/drain 116 consisting of an N$^-$-type diffused layer and a second gate insulating film 124, and respectively have gates 135a and 125b. On the surface of the P well 121 there are formed P$^+$-type diffused layers 117 and 1271

One of the source/drains 116 is provided at a position adjacent to the diffused layer 117, and is connected to the diffused layer 117 by means of an aluminum wiring 110ac provided via a contact hole 109ac. The other of the source/drains 116 of T11 and T12 are connected to the second aluminum wiring 120ba (W1) and the second aluminum wiring 120bb (W2). The respective gates 125a and 125b are connected via contact holes 109ba and 109bb to a first aluminum wiring 110ba which is the output signal line of LS1a and a first aluminum wiring 110bb which is the output signal line of LS1b, respectively. The P+-type diffused layer 127 is connected to a first aluminum wiring 110ab to which is applied the erasure voltage via a contact hole 109ab FIGS. 1, 2, and 3B.

When one considers solely the energization of T11 and T12, the output signal from the second level shifters for this purpose suffices if it is higher than the value of −14 V. As will be described later the second level shifters in this embodiment will be constituted of a CMOS transistor. In that case, the output signal depends on the voltage (second voltage) applied to a second N well that forms the CMOS transistor. In order to avoid the forward voltage application for the second N well and the P-type silicon substrate the voltage has to be given a value higher than 0 V. When T11 and T12 are de-energized, the maximum potential difference between the source/drain on the side making connection with W1 and the like and the N well is on the order of 28 V. Because of this, it is desirable to adopt such structures as the DDD structure, an offset structure with respect to 125a, and the like for this source/drain 116. It is also effective to increase the thickness of the second gate insulating film 124 and to increase the gate length. Since the first N well 111 is given a voltage of 5 V, the potential difference between the N well and the P well is 21 V. As this is a voltage application in the opposite direction, and the junction breakdown voltage between the P well and the N well is several tens of volts the above-mentioned application of the voltage will cause no problems. Further, it is preferable that the junction depth of the N well 111 be greater than the junction depth of the P well 121 by more than 1 μm.

The transistors T21, T22, and the like are formed on the surface of the first N well 111. The transistors T21, T22, and the like have a source/drain 107 consisting of P+-type diffused layer, second gate insulating film 124, and have gates 135a and 135b, respectively. Further, an N+-type diffused layer 126 is formed on the surface of the N well 111. One of the source/drains 107 for the respective members of T21 and T22 is connected to a second aluminum wiring 120ba (W1) and a second aluminum wiring (W2) via contact holes 119ca and 119cb, respectively. The other of the source/drains 107 for T21 and T22 are connected respectively to the first level shifters LS1 and LS2 via a contact hole 119ea and a second aluminum wiring 120ca, and a contact hole 119eb and a second aluminum wiring 120cb. The respective gates 135a and 135b are connected to the input terminals of the second level shifters LS1a and LS2a, respectively, via a contact hole 109ca and a first aluminum wiring 110ca, and a contact hole 109cb and a first aluminum wiring 110cb. An N+-type diffused layer 126 is connected to a first aluminum wiring 110aa having the first voltage via a contact hole 109aa [FIGS. 1, 2, and 3C].

Since the flash memory according to this embodiment is given a circuit constitution and a device structure as described in the above, the deterioration in the reliability of the memory cells at the time of erase operation can be suppressed. Further, in the peripheral circuit, there will be given no voltage application to the P-N junction in the forward direction, and even in parts where the voltage application in the reverse direction amounts to large values it is possible to suppress the generation of the hot holes by the adoption of well-known technology, enabling to obtain peripheral circuits with high reliability. Moreover, at the time of erase or write, there is no need to apply specified voltages only to the sources of specified memory cells so that the reduction of the cell size can be facilitated. Furthermore, there exist no restrictions to the sector erasure, and there are no restrictions either as to the adoption not only of the NOR type but also the NAND type.

Referring also to FIGS. 4A to 4E which show schematic sectional views arranged in the order of processes, for the part indicated by the line B—B in FIG. 2, in the flash memory of the first embodiment described in the above, first, the silicon oxide film 102 is formed on the surface of the P-type silicon substrate, and N wells such as the first N well 111 and the like are formed by ion implantation and heat treatment. Next, P wells such as the first P well 121 and the like are formed by ion implantation and heat treatment. At this time, the first P well 121 is formed on the surface of the first N well 111 [FIG. 4A].

After removal of the silicon oxide film 102, a field oxide film 103 is formed, and the first gate insulating film 104 consisting of a silicon oxide film is formed by thermal oxidation. Next, an N+-type polycrystalline silicon film 105 is formed allover the surface [FIG. 4B].

An etching which leaves the polycrystalline silicon film 105 in island form only for the parts that cover sufficiently the channel parts of the memory cells is carried out, then only the peripheral circuit formation part of the first gate insulating film 104 is removed by etching. Next, the second gate insulating films 114 and 124 are formed allover the surface including the parts of the surface of the polycrystalline silicon film 105 left in island forms. The second gate insulating films 141 and 124 include the silicon oxide films due to the thermal oxidation, and these films may be made into laminated films of a silicon oxide film, a silicon nitride film, and a silicon oxide film as needed [FIGS. 3A to 3C, and 4C].

After depositing a conductor film allover the surface, etching for the formation of gates, including the parts for the memory cells, is carried out. In the parts for the memory cells, as a result of the etching, formation of the control gates 115a and 115b, shaping of the second gate insulating film, and formation of the floating gate 105a by the shaping of the polycrystalline silicon film 105 that was left in island form are carried out. On the other hand, in the parts for the memory cells, there are formed the gates 125a, 125b, 135a, 135b, and the like as a result of this etching. Next, the N+-type source 106a, the drain 106b, the source/drain 116, and the N+-type diffused layer 126 are formed by means of ion implantation of arsenic that uses a photoresist film 130 as the mask [FIGS. 3A to 3C, and 4D].

After removal of the photoresist film 130, p+-type source/drain 107, the P−-type diffused layers 117, 127, and the like are formed by ion implantation of boron, for example, that uses a photoresist film 131 as the mask [FIGS. 3A to 3C, and 4E].

The fabrication processes hereafter rely on the well-known technology so that they will not be reproduced here.

Figure 5:
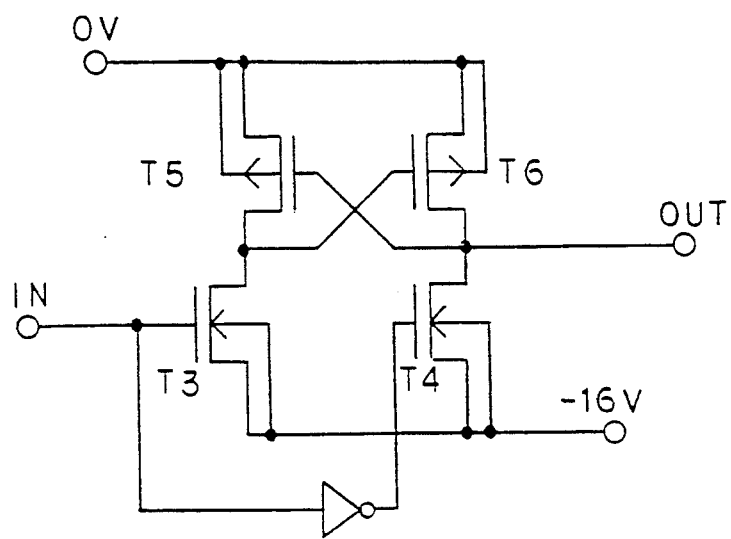
FIG. 5 is a circuit diagram for the second level shifter in the first embodiment.

Referring to FIG. 5 which shows a circuit diagram for the level shifter, it can be seen that the second level shifters employed in this embodiment is constituted of a positive feedback circuit. A CMOS inverter consisting of a second N-channel MOS transistor T3 and a second P-channel MOS transistor T5, and a CMOS inverter consisting of a third N-channel MOS transistor T4 and a third P-channel MOS transistor T6 are connected to form a flip-flop, and a voltage of −16 V is applied to the sources of T3 or T4, and a voltage of 0 V is applied to the sources of T5 and T6, with the input signals to T3 and T4 being in the opposite phase. For example, when 5 V and 0 V are input to the input terminal IN, the output terminal OUT outputs 0 V and −16 V, respectively.

The second fabrication method will be described briefly. The second N well is formed at the same time as the first N well 111 is formed. The second P well is formed on the surface of the second N well at the same time as the first P well 121 is formed. The N-channel MOS transistors T3 and T4 are formed on the surface of the second P well at the same time as the first N-channel MOS transistors T11, T12, and the like are formed. Similarly, the P-channel MOS transistors T5 and T6 are formed on the surface of the second N well at the same time as the formation of the first P-channel MOS transistors T21, T22, and the like. A voltage of −16 V is applied to the second P well, and the sources of T3 and T4 are respectively short-circuited to the second P well. A voltage of 0 V is applied to the second N well, and the sources of T5 and T6 are respectively short-circuited to the second N well.

Figure 6:
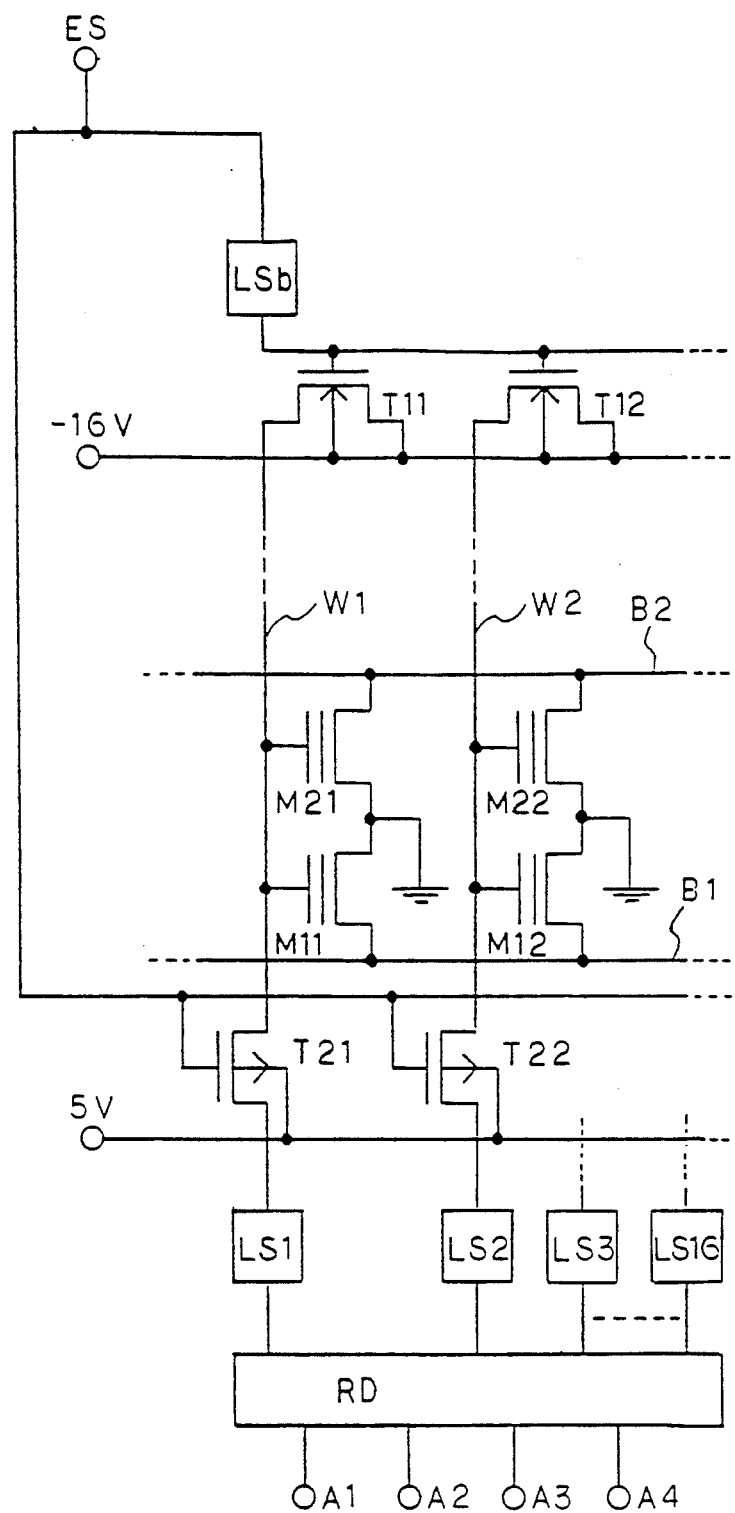
FIG. 6 is a circuit diagram for describing the outline of the circuit constitution for a second embodiment of the invention.

Referring to FIG. 6 showing the principal part of the circuit structure of the flash memory, the second embodiment of the invention is not of sector flash type but is a flash memory which erases all the memory cells simultaneously. Because of this, the sector decoder provided in the first embodiment can be obviated, and a single level shifter LSb alone suffices as the second level shifter. The constitution of LSb is the same as that of the level shifter in the first embodiment. In this embodiment, an erase signal of 5 V or 0 V is input to a terminal ES. This erase signal is input directly to the gates of all of the first P-channel MOS transistors T21, T22, and the like. Similarly, the output signal of 0 V or −16 V from LSb is input to the gates of all of the first N-channel MOS transistors T11, T12, and the like.

The signal wirings that are connected to the gates of the first N-channel MOS transistors T11, T12, and the like, and the signal wirings that are connected to the gates of the first P-channel MOS transistors T21, T22, and the like can be made to require smaller occupation areas. Because of this, it becomes easy to place the connecting terminal for T11 and W1, for example, to be a terminal on the opposite side to the terminal of W1 where T21 is connected, as shown in the figure. The reduction of the area in this embodiment can be made easier compared with the first embodiment for the reason just mentioned, and for the fact that the sector decoder is made unnecessary and that only one of the second level shifter suffices for the required operation.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

I claim:

1. A semiconductor memory device comprising, on a P-type silicon substrate, stacked gate type memory cells arrayed in matrix form along bit lines and word lines, each of said word lines serving as control gates of associated ones of said memory cells, and a peripheral circuit including a plurality of first level shifters provided correspondingly to said word lines and a row decoder connected to said first level shifters, said silicon substrate being maintained at a predetermined substrate voltage and erasure being carried out by applying an erase voltage having a negative value with respect to said substrate voltage to said control gates of selected ones of said memory cells, said peripheral circuit further including a first N well selectively formed in said P-type silicon substrate and supplied with a first voltage which is higher than said substrate voltage, a plurality of first P-channel MOS transistors corresponding in number to said word lines and formed in said N well each of said first P-channel MOS transistors being connected between an associated one of said word lines and an associated one of said first level shifters, a first P well selectively formed in said first N well and separated from said P-type silicon substrate by said first N well, said first P well being supplied with said erase voltage, a plurality of first N-channel MOS transistors corresponding in number to said word lines and formed in said first P well, each of said first N-channel MOS transistors being connected between said first P well and an associated one of said word lines, a plurality of input terminals each supplied operatively with one of said substrate voltage and said first voltage and each connected to a gate of an associated one of said first P-channel MOS transistors, and a plurality of second level shifters having a plurality of input nodes each connected to an associated one of said input terminals and a plurality of output nodes each connected to a gate of an associated one of said first N-channel MOS transistors, each of said second level shifters responding to a voltage at the input node thereof and operatively generating at the output node thereof one of a second voltage and said erase voltage, said second voltage being equal to or higher than said substrate voltage.

2. The memory device as claimed in claim 1, further comprising a sector decoder supplying each of said input terminals with said substrate voltage in a data read or a data write operation mode, said sector decoder supplying in a data erase operation mode selected one or ones of said input terminals with said substrate voltage and remaining one or ones of said input terminals with said first voltage.

3. The memory device as claimed in claim 1, wherein said semiconductor memory device is of a NOR type.

4. The memory device as claimed in claim 1, wherein said semiconductor memory device is of a NAND type.

5. The memory device as claimed in claim 1, further comprising a second N well selectively formed in said silicon substrate and supplied with said second voltage and a second P well selectively formed in said second N well with an isolation from said silicon substrate by said second N well and supplied with said erase voltage, each of said second level shifters including second and third P-channel MOS transistors formed in said second N well and second and third N-channel MOS transistors formed in said second P well.

6. The memory device as claimed in claim 5, wherein said second P-channel MOS transistor having a source connected to said second N well, a drain connected to one of said output nodes and a gate, said third P-channel MOS transistor having a source connected to said N well, a drain connected to the gate of said second P-channel MOS transistor and a gate connected to said one of said output nodes, said second N-channel MOS transistor having a source connected to said second P well, a drain connected to said one of said output nodes and a gate connected to one of said input nodes through an inverter, and said third N-channel MOS transistor having a source connected to said P well, a drain connected to the drain of said third P-channel MOS transistor and a gate connected to said one of said input nodes.

7. A semiconductor memory device comprising a plurality of word lines, a plurality of bit lines, a plurality of memory cell transistors each connected to one of said word lines and one of said bit lines, each of said memory cell transistors being formed in a semiconductor substrate of one conductivity type and having a floating gate and a control gate, a first circuit having a plurality of output nodes and generating in a data write mode a write voltage to a selected one of said output nodes, in a data read mode a read voltage to a selected one of said output nodes and in a data erase mode a first voltage to each of said output nodes, said first voltage being different from any one of said write and read voltages, a first well region of an opposite conductivity type and supplied with said read voltage, a plurality of first MOS transistors of a first channel type formed in said first well region, each of said first MOS transistors being connected between an associated one of said output nodes and an associated one of said word lines, a second well region of said one conductivity type formed in said first well region with an isolation from said semiconductor substrate by said first well region and supplied with an erase voltage, a plurality of second MOS transistors of a second channel type formed in said second well region, each of said second MOS transistors being connected between said second well region and an associated one of said word lines, a second circuit coupled to said first MOS transistors to turn each of said first MOS transistors on in any one of said data write and data read modes and selected one or ones of said first MOS transistors on in said data erase mode, and a third circuit coupled to said second MOS transistors to turn each of said second MOS transistors off in any one of said data write and data erase modes and selected one or ones of said second MOS transistors on in said data erase mode.

8. The device as claimed in claim 7, wherein each of said semiconductor substrate and said second well region is of a P-type and said first well region is of an N-type.

9. The device as claimed in claim 8, wherein said first voltage is a ground voltage, said read voltage being a positive voltage of a first value, said write voltage being a positive voltage of a second value larger than said first value, and said erase voltage being a negative voltage.

* * * * *